(12) United States Patent
Lee et al.

(10) Patent No.: US 10,903,300 B2
(45) Date of Patent: Jan. 26, 2021

(54) DISPLAY PANEL

(71) Applicant: Samsung Display Co., Ltd., Yongin-si (KR)

(72) Inventors: Dong-hyun Lee, Suwon-si (KR); Deukjong Kim, Cheonan-si (KR); Jaehak Lee, Suwon-si (KR); Deok-young Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/244,262

(22) Filed: Jan. 10, 2019

(65) Prior Publication Data

US 2019/0214450 A1    Jul. 11, 2019

(30) Foreign Application Priority Data

Jan. 11, 2018    (KR) ........................ 10-2018-0004035

(51) Int. Cl.
| | |
|---|---|
| *H01L 27/32* | (2006.01) |
| *G09G 3/3233* | (2016.01) |
| *G09G 3/3266* | (2016.01) |
| *H01L 51/00* | (2006.01) |
| *G09G 3/3283* | (2016.01) |
| *H01L 51/52* | (2006.01) |

(52) U.S. Cl.
CPC ....... *H01L 27/3276* (2013.01); *G09G 3/3233* (2013.01); *G09G 3/3266* (2013.01); *G09G 3/3283* (2013.01); *H01L 27/3218* (2013.01); *H01L 27/3262* (2013.01); *H01L 51/0096* (2013.01); *G09G 2300/0426* (2013.01); *G09G 2330/06* (2013.01); *H01L 27/3246* (2013.01); *H01L 27/3258* (2013.01); *H01L 51/5206* (2013.01); *H01L 51/5237* (2013.01)

(58) Field of Classification Search
CPC ..................................................... H01L 27/32
See application file for complete search history.

(56) References Cited

U.S. PATENT DOCUMENTS

2017/0316739 A1    11/2017    Oh et al.

FOREIGN PATENT DOCUMENTS

| KR | 10-2016-0082883 | 7/2016 |
| KR | 10-2017-0080212 | 7/2017 |
| KR | 10-1868941 | 6/2018 |

*Primary Examiner* — Marvin Payen
(74) *Attorney, Agent, or Firm* — H.C. Park & Associates, PLC

(57) ABSTRACT

A display panel including a first pixel row comprising a plurality of first pixels arranged in a first direction; a second pixel row comprising a plurality of second pixels, each of the plurality of second pixels overlaps each of the plurality of first pixels in a second direction crossing the first direction, and a third pixel, the third pixel does not overlap the plurality of first pixels in the second direction, wherein the plurality of second pixels and the third pixel being arranged in the first direction; and a first vertical line comprising a first sub-line, the first sub-line is extended in the second direction and is connected to the third pixel, and a second sub-line, the second sub-line is extended from an end portion of the first sub-line in a direction away from the plurality of first pixels at a first angle relative to the second direction.

20 Claims, 8 Drawing Sheets

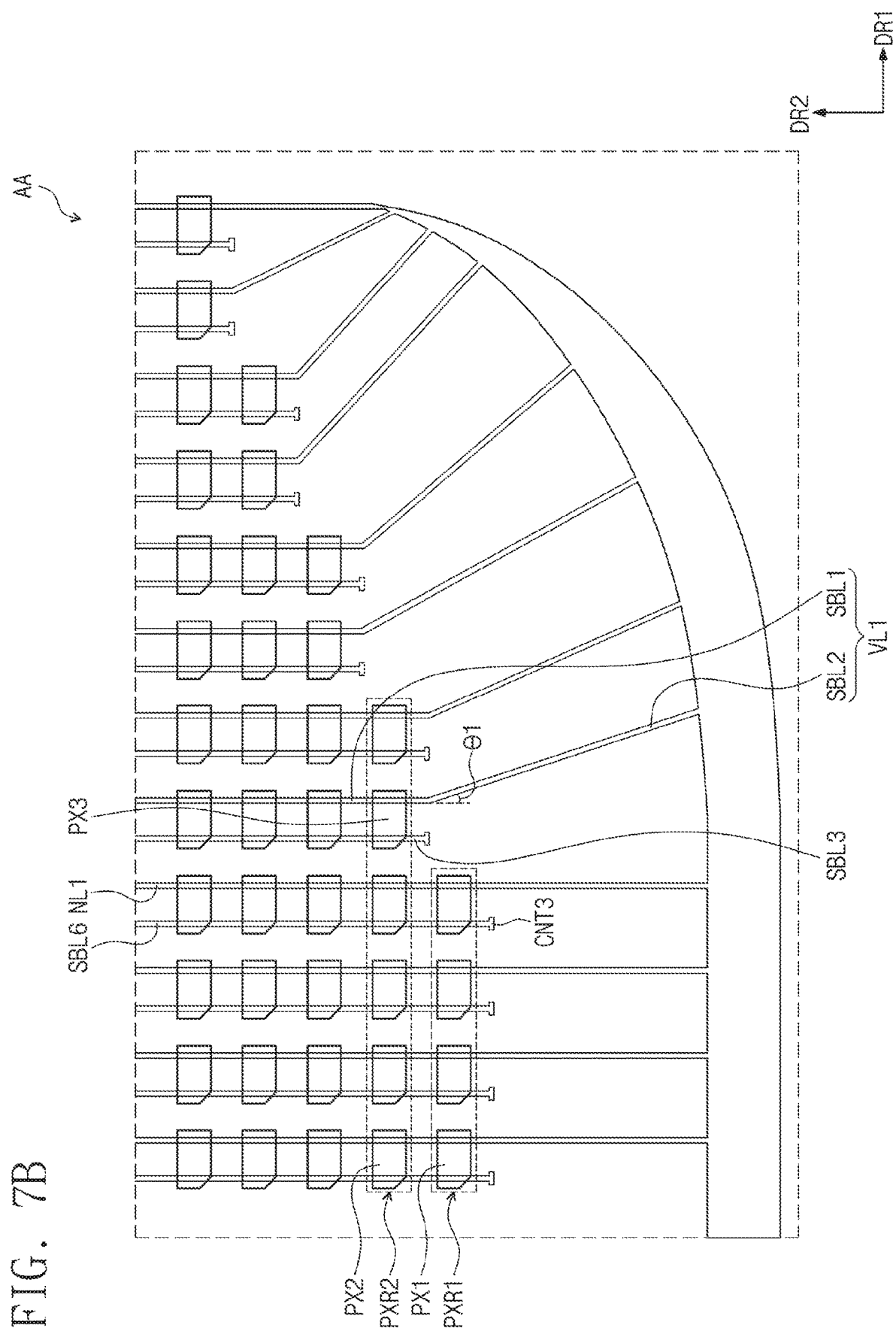

DISPLAY PANEL

CROSS-REFERENCE TO RELATED APPLICATIONS

This application claims priority from and the benefit of Korean Patent Application No. 10-2018-0004035, filed on Jan. 11, 2018, which is hereby incorporated by reference for all purposes as if fully set forth herein.

BACKGROUND

Field

Exemplary embodiments of the invention relate generally to a display panel whose display region is configured to have a rounded corner, and, more specifically, to shapes of data and power lines in a display panel.

Discussion of the Background

Various display devices are being developed for use in multimedia devices such as televisions, mobile phones, tablet computers, navigation systems, gaming machines, and the like. Recently, wearable display devices with enhanced portability are being developed.

For functional or esthetical purposes, such recently-developed display devices are configured to provide a display region with rounded corners.

However, in the case where interconnection lines in the display device are arranged to realize the rounded corner of the display region, pixels may be damaged by an electrostatic current.

The above information disclosed in this Background section is only for understanding of the background of the inventive concepts, and, therefore, it may contain information that does not constitute prior art.

SUMMARY

Some exemplary embodiments of the inventive concept provide a display device, which is configured to prevent an electrostatic current, which is produced in an internal interconnection line of a display panel, from flowing to an internal element of a pixel and thereby to prevent the pixel of the display panel from being damaged.

Additional features of the inventive concepts will be set forth in the description which follows, and in part will be apparent from the description, or may be learned by practice of the inventive concepts.

According to some exemplary embodiments of the inventive concept, a display panel may include a first pixel row, a second pixel row, and a first vertical line.

In some exemplary embodiments, the first pixel row may include a plurality of first pixels arranged in a first direction.

In some exemplary embodiments, the second pixel row may include a plurality of second pixels, which is overlapped with the plurality of first pixels in a second direction crossing the first direction, and a third pixel, which is not overlapped with the plurality of first pixels in the second direction. The plurality of second pixels and the third pixel may be arranged in the first direction.

In some exemplary embodiments, the first vertical line may include a first sub-line, which is extended in the second direction and is connected to the third pixel, and a second sub-line, which is extended from an end portion of the first sub-line in a direction away from the plurality of first pixels at a first angle relative to the second direction.

In some exemplary embodiments, the first angle may be an acute angle.

In some exemplary embodiments, a portion of the second sub-line may be overlapped with the first pixel row in the first direction.

In some exemplary embodiments, the first sub-line and the second sub-line may be provided on a same layer.

In some exemplary embodiments, the first sub-line and the second sub-line may be provided on different layers, and the first sub-line and the second sub-line may be connected to each other through a contact hole.

In some exemplary embodiments, the first vertical line may be configured to provide electric power, which is supplied from an external element, to the third pixel.

In some exemplary embodiments, the display panel may further include a second vertical line including a third sub-line, which is extended in the second direction and is connected to the third pixel, and a fourth sub-line, which is extended from an end portion of the third sub-line in a direction away from the plurality of first pixels at a second angle relative to the second direction.

In some exemplary embodiments, the second vertical line may be configured to provide a data signal to the third pixel.

In some exemplary embodiments, the third pixel may include a light emitting device, a first transistor electrically connected to the light emitting device, and a second transistor connected to the third sub-line. Each of the first transistor and the second transistor includes an input electrode, an output electrode, and a control electrode.

In some exemplary embodiments, the first sub-line, the second sub-line, and the third sub-line may be provided on a same layer as the input electrode and the output electrode.

In some exemplary embodiments, the fourth sub-line may be provided on a same layer as the control electrode.

In some exemplary embodiments, the display panel may further include a first horizontal line, which is connected to the third pixel and is extended in the first direction. The first horizontal line and the control electrode may be provided on a same layer.

In some exemplary embodiments, the first horizontal line may be configured to provide a scan signal to the control electrode of the second transistor.

In some exemplary embodiments, the display panel may further include a second horizontal line, which is connected to the third pixel and is extended in the first direction. The second horizontal line may be provided on a same layer as the control electrode and may be configured to provide an emission control signal to the third pixel.

According to some exemplary embodiments of the inventive concept, a display panel may include first pixels, second pixels, a first horizontal line, and a first vertical line.

In some exemplary embodiments, the first pixels may be arranged in a first direction, and each of the first pixels may include an input electrode, an output electrode, and a control electrode.

In some exemplary embodiments, the second pixels may be arranged in the first direction, and each of second pixels may include an input electrode, an output electrode, and a control electrode.

In some exemplary embodiments, the first horizontal line may be connected to the first pixels, may be provided on a same layer as the control electrode, and may be extended in the first direction.

In some exemplary embodiments, the first vertical line may include a first sub-line, which is extended in a second"

direction crossing the first direction and is connected to one of the second pixels, and a second sub-line, which is extended away from both of two opposite end portions of the first horizontal line at a specific angle relative to the second direction.

In some exemplary embodiments, the number of the plurality of second pixels may be greater than that of the plurality of first pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 7A, 7B, and 7C illustrate lines of FIG. 6 by layer.

Figure 1:
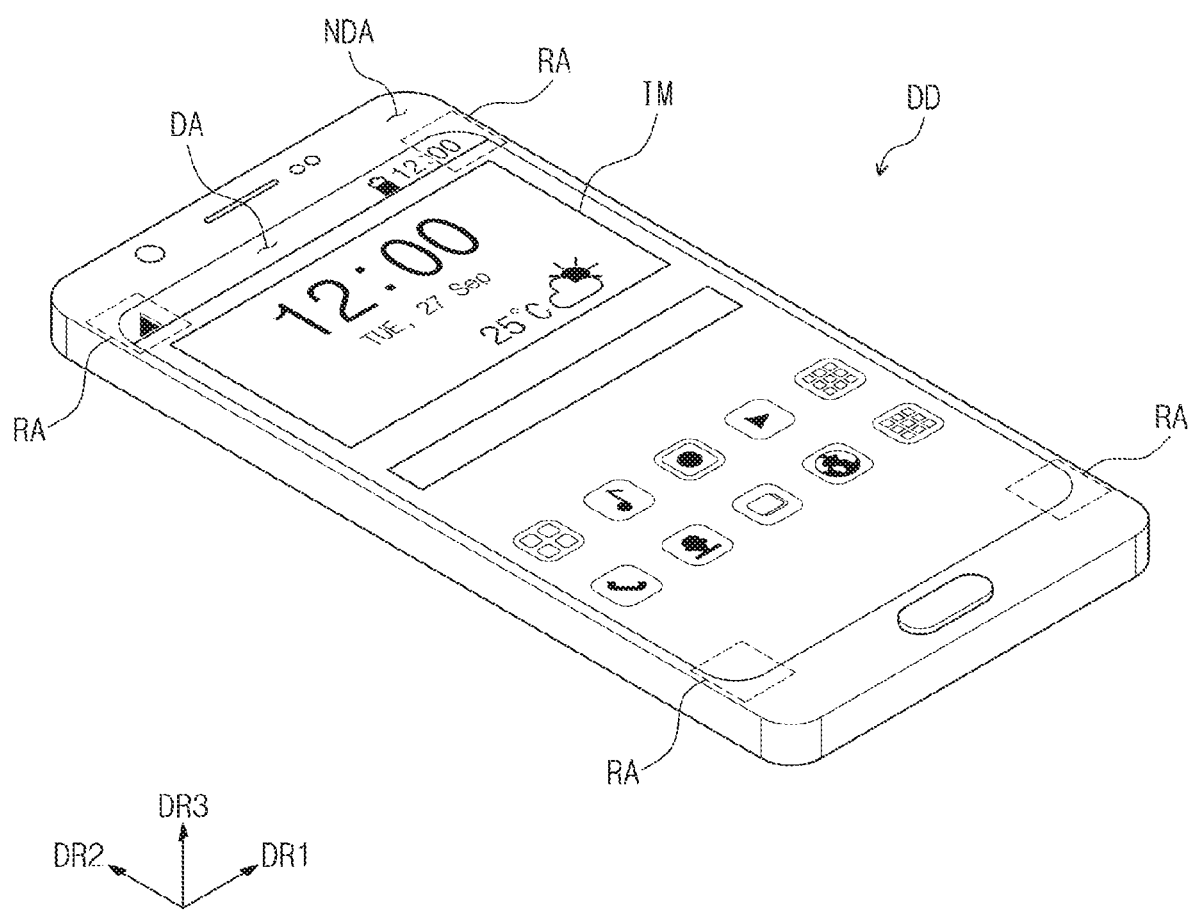
FIG. 1 is a perspective view illustrating a display device according to some exemplary embodiments of the inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD according to some exemplary embodiments of the inventive concept.

FIG. 1 illustrates an example in which the display device DD is a smart phone, but the inventive concept is not limited thereto. The display device DD may be used for large-sized electronic devices (e.g., television sets and monitors) or small- or medium-sized electronic devices (e.g., smart phones, tablets, car navigation systems, game machines, and smart watches).

A display region DA and a non-display region NDA may be defined in the display device DD.

The display region DA, which is used to display an image IM, may be parallel to both of a first direction axis DR1 and a second direction axis DR2. Hereinafter, a third direction axis DR3 will be used to refer to a thickness direction of the display device DD (i.e., a direction normal to a top surface of the display region DA). A front or top surface and a rear or bottom surface of each member may be distinguished, based on the third direction axis DR3. However, directions indicated by the first to third direction axes DR1, DR2, and DR3 may be relative concepts, and in certain exemplary embodiments, they may be changed to indicate other directions. Hereinafter, first to third directions may be directions indicated by the first to third direction axes DR1, DR2, and DR3, respectively, and will be identified with the same reference numbers.

The non-display region NDA may be adjacent to the display region DA and may be not be used to display the image IM. A bezel region of the display device DD may be defined by the non-display region NDA. As shown in FIG. 1, the image IM may include application icons and a clock widget.

In some exemplary embodiments, the display region DA may have a rectangular shape with rounded corners or vertices. In other words, the display region DA may include a rounded region RA including at least a rounded corner. The non-display region NDA may be provided to enclose the display region DA. However, the inventive concept is not limited thereto, and the shapes of the display region DA and the non-display region NDA may be variously changed in a complementary manner.

Figure 2:
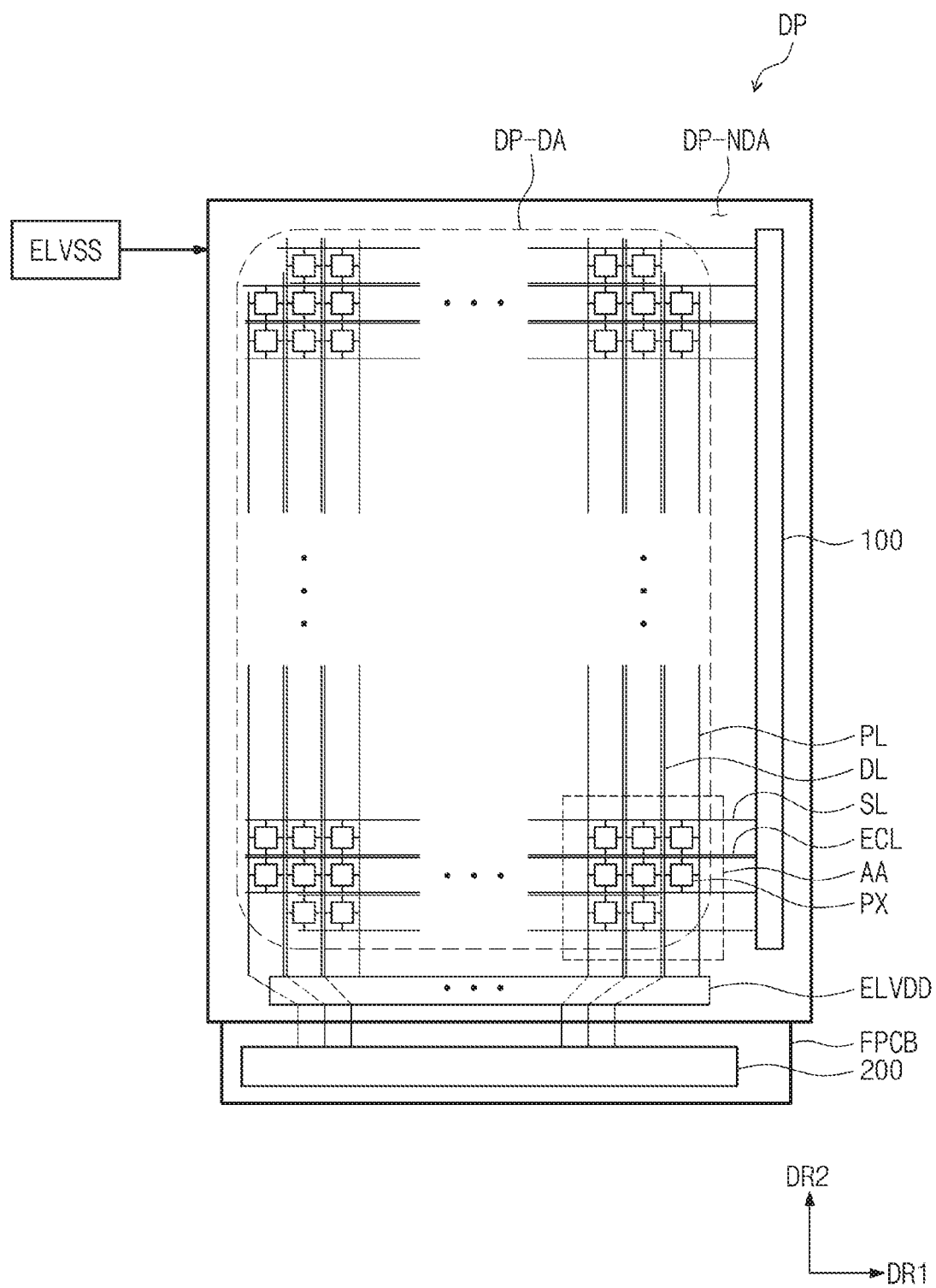
FIG. 2 is a block diagram illustrating a display panel according to some exemplary embodiments of the inventive concept.

FIG. 2 is a block diagram illustrating a display panel DP according to some exemplary embodiments of the inventive concept.

The display panel DP may include a display region DP-DA and a non-display region DP-NDA, when viewed in a plan view. In the present exemplary embodiment, the non-display region DP-NDA may be defined along a border of the display region DP-DA. The display region DP-DA and the non-display region DP-NDA of the display panel DP may be overlapped with a display region DD-DA and a non-display region DD-NDA, respectively, of the display device DD shown in FIG. 1.

Figure 3:
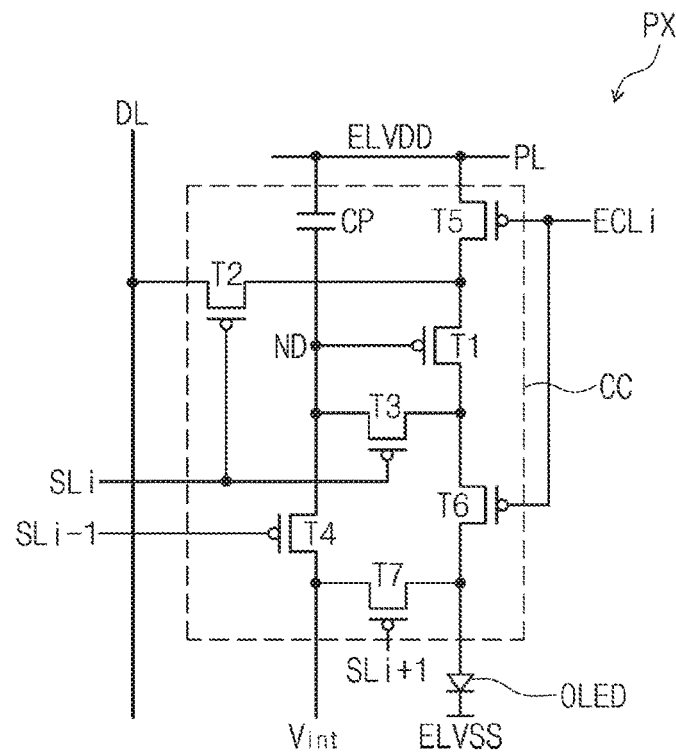
FIG. 3 is an equivalent circuit diagram illustrating a pixel according to some exemplary embodiments of the inventive concept.

The display panel DP may include a scan driver 100, a data driver 200, a plurality of scan lines SL, a plurality of emission control lines ECL, a plurality of data lines DL, and a plurality of power lines PL, and a plurality of pixels PX. The pixels PX may be provided in the display region DP-DA. Each of the pixels PX may include an organic light emitting device OLED and a pixel circuit CC, which are connected to each other, as shown in FIG. 3.

The scan driver 100 may include a scan control driver and an emission control driver.

The scan control driver may be configured to generate scan signals and to sequentially output the generated scan signals to the scan lines SL. The emission control driver may be configured to generate emission control signals and to output the generated emission control signals to the emission control lines ECL.

In certain exemplary embodiments, the scan control driver and the emission control driver of the scan driver 100 may not be distinguished from each other and may constitute a single circuit.

The scan driver 100 may include a plurality of thin-film transistors that are formed by the same process as that for the driving circuit of the pixel PX (e.g., by a low temperature polycrystalline silicon (LTPS) process or a low temperature polycrystalline oxide (LTPO) process).

The data driver 200 may be configured to output data signals to the data lines DL. The data signals may be provided in the form of analog voltages, whose levels are determined based on gradation levels of the image data.

In some exemplary embodiments, the data driver 200 may be mounted on a printed circuit board FPCB, and the printed circuit board FPCB may be connected to pads, which are provided at end portions of the data lines DL. However, the inventive concept is not limited thereto, and the data driver 200 may be directly mounted on the display panel DP.

The scan lines SL may extend in the first direction DR1 and may be arranged in the second direction DR2 crossing the first direction DR1. In some exemplary embodiments, the first direction DR1 and the second direction DR2 may be perpendicular to each other, but the inventive concept is not limited thereto.

The emission control lines ECL may extend in the first direction DR1 and may be arranged in the second direction DR2. In other words, each of the emission control lines ECL may be provided parallel to a corresponding one of the scan lines SL.

The data lines DL may extend in the second direction DR2 and may be arranged in the first direction DR1 crossing the second direction DR2. The data lines DL may be used to provide the data signals to corresponding ones of the pixels PX.

The power lines PL may extend in the second direction DR2 and may be arranged in the first direction DR1. Each of the power lines PL may be used to provide a first power ELVDD to corresponding ones of the pixels PX.

Each of the pixels PX may be coupled to a corresponding one of the scan lines SL, a corresponding one of the emission control lines ECL, a corresponding one of the data lines DL, and a corresponding one of the power lines PL.

The pixels PX may be arranged in a plurality of rows. In some exemplary embodiments, the number of the pixels PX constituting one of the rows may be different from the number of the pixels PX constituting another row. This is because the display region DP-DA of the display panel DP or a corner portion of the display region DA of the display device DD has a rounded shape, as shown in FIGS. 1 and 2.

Figure 4:
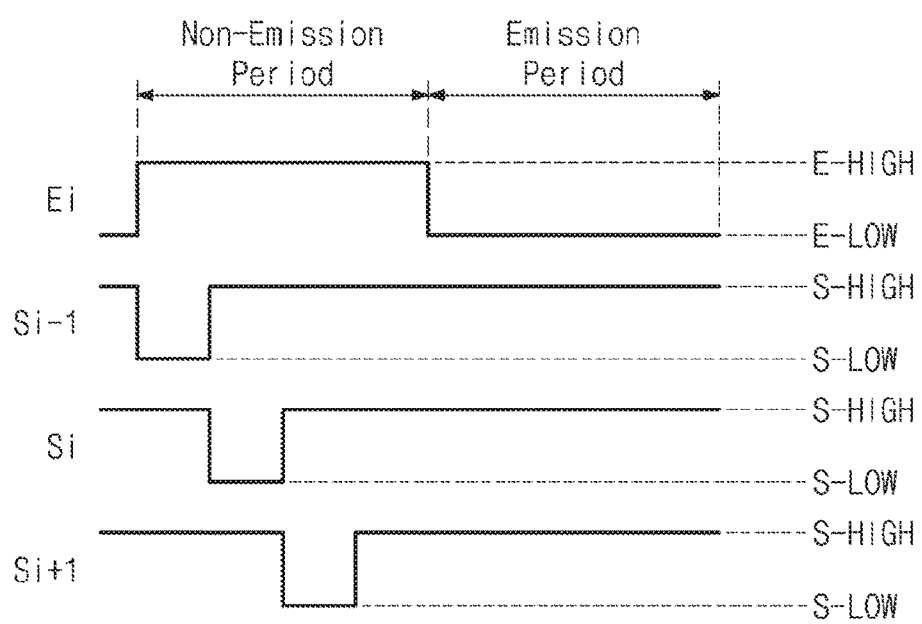
FIG. 4 is a timing diagram exemplarily illustrating an emission control signal and scan signals to be applied to the pixel of FIG. 3.

FIG. 3 is an equivalent circuit diagram illustrating the pixel PX according to some exemplary embodiments of the inventive concept. FIG. 4 is a timing diagram exemplarily illustrating an emission control signal Ei and scan signals Si−1, Si, and Si+1 to be applied to the pixel of FIG. 3. FIG. 3 illustrates one of the pixel PX connected to an i-th scan line SLi and an i-th emission control line ECLi.

The pixel PX may include the organic light emitting device OLED and the pixel circuit CC. The pixel circuit CC may include a plurality of transistors T1, T2, T3, T4, T5, T6, T7 and a capacitor CP. The pixel circuit CC may be configured to control an amount of current flowing through the organic light emitting device OLED, in response to the data signal.

The organic light emitting device OLED may be configured to emit light, the OLED's brightness is determined by an amount of current to be supplied from the pixel circuit CC. For this, the first power ELVDD may be set to a level higher than that of a second power ELVSS.

Each of the transistors T1-T7 may include an input or source electrode, an output or drain electrode, and a control or gate electrode. In the present specification, for convenience in description, one of the input and output electrodes may be referred to as "a first electrode", and the other may be referred to as "a second electrode".

The first electrode of the first transistor T1 may be coupled to the first power ELVDD through the fifth transistor T5, and the second electrode may be coupled to an anode electrode of the organic light emitting device OLED through the sixth transistor T6. In the present specification, the first transistor T1 may be referred to as "a driving transistor".

The first transistor T1 may control an amount of current flowing through the organic light emitting device OLED, in response to a voltage applied to the control electrode.

The second transistor T2 may be coupled between the data line DL and the first electrode of the first transistor T1. The control electrode of the second transistor T2 may be coupled to the i-th scan line SLi. If the i-th scan signal Si is provided to the i-th scan line SLi, the second transistor T2 may be turned on to allow the data line DL to be electrically coupled to the first electrode of the first transistor T1.

The third transistor T3 may be coupled between the second electrode and the control electrode of the first transistor T1. The control electrode of the third transistor T3 may be coupled to the i-th scan line SLi. If the i-th scan signal Si is provided to the i-th scan line SLi, the third transistor T3 may be turned on to allow the second electrode and the control electrode of the first transistor T1 to be electrically coupled to each other. Thus, if the third transistor T3 is turned on, the first transistor T1 may act like a diode.

The fourth transistor T4 may be coupled between a node ND and an initialization power generator (not shown). The control electrode of the fourth transistor T4 may be coupled to an (i−1)-th scan line SLi−1. If an (i−1)-th scan signal Si−1 is provided to the (i−1)-th scan line SLi−1, the fourth transistor T4 may be turned on to allow an initialization voltage $V_{int}$ to be provided to the node ND.

The fifth transistor T5 may be coupled between the power line PL and the first electrode of the first transistor T1. The control electrode of the fifth transistor T5 may be coupled to the i-th emission control line ECLi.

The sixth transistor T6 may be coupled between the second electrode of the first transistor T1 and the anode electrode of the organic light emitting device OLED. The control electrode of the sixth transistor T6 may be coupled to the i-th emission control line ECLi.

The seventh transistor T7 may be coupled between the initialization power generator (not shown) and the anode electrode of the organic light emitting device OLED. The control electrode of the seventh transistor T7 may be coupled to an (i+1)-th scan line SLi+1. If an (i+1)-th scan signal Si+1 is provided to the (i+1)-th scan line SLi+1, the seventh transistor T7 may be turned on to allow the initialization voltage $V_{int}$ to be provided to the anode electrode of the organic light emitting device OLED.

The seventh transistor T7 may be configured to improve a black representation ability of the pixel PX. In detail, if the seventh transistor T7 is turned on, a parasitic capacitor (not shown) of the organic light emitting device OLED may be discharged. In this case, when it is necessary to represent black, it may be possible to prevent light from being emitted from the organic light emitting device OLED by a leakage current from the first transistor T1 and thereby to improve the black representation ability of the pixel PX.

In addition, although FIG. 2 illustrates an example in which the control electrode of the seventh transistor T7 is coupled to the (i+1)-th scan line SLi+1, the inventive concept is not limited thereto. In certain exemplary embodiments, the control electrode of the seventh transistor T7 may be coupled to the i-th scan line SLi or the (i−1)-th scan line SLi−1.

FIG. 3 illustrates an example in which PMOS transistors are used as the transistors T1-T7, but the inventive concept is not limited thereto. In certain exemplary embodiments, NMOS transistors may be used to constitute the pixel PX. In other exemplary embodiments, the pixel PX may be configured to include not only NMOS transistors but also PMOS transistors.

The capacitor CP may be provided between the power line PL and the node ND. The capacitor CP may be configured to be charged to a voltage level corresponding to the data signal. If the fifth and sixth transistors T5 and T6 are turned on, an amount of current flowing through the first transistor T1 may be determined, depending on a voltage level of the capacitor CP.

The inventive concept is not limited to the structure of the pixel PX shown in FIG. 3. In certain exemplary embodiments, the circuit structure of the pixel PX may be variously changed to control the light emitting operation of the organic light emitting device OLED.

Referring to FIG. 4, the emission control signal Ei may have a high level E-HIGH or a low level E-LOW. Each of the scan signals Si−1, Si, and Si+1 may have a high level S-HIGH or a low level S-LOW.

If the emission control signal Ei has the high level E-HIGH, the fifth transistor T5 and the sixth transistor T6 may be turned off. If the fifth transistor T5 is turned off, the power line PL may be electrically disconnected from the first electrode of the first transistor T1. If the sixth transistor T6 is turned off, the second electrode of the first transistor T1 may be electrically disconnected from the anode electrode of the organic light emitting device OLED. Thus, when the emission control signal Ei having the high level E-HIGH is applied to the i-th emission control line ECLi, the organic light emitting device OLED may not emit light.

Thereafter, if the (i−1)-th scan signal Si−1 provided to the (i−1)-th scan line SLi−1 has the low level S-LOW, the fourth transistor T4 may be turned on. If the fourth transistor T4 is turned on, the initialization voltage $V_{int}$ may be provided to the node ND.

If the i-th scan signal Si provided to the i-th scan line SLi has the low level S-LOW, the second transistor T2 and the third transistor T3 may be turned on.

If the second transistor T2 is turned on, the data signal may be provided to the first electrode of the first transistor T1. Here, since the node ND is initialized to the initialization voltage $V_{int}$, the first transistor T1 may be turned on. If the first transistor T1 is turned on, a voltage corresponding to the data signal may be provided to the node ND. Thus, the capacitor CP may be charged by the voltage corresponding to the data signal.

If the (i+1)-th scan signal Si+1 provided to the (i+1)-th scan line SLi+1 has the low level S-LOW, the seventh transistor T7 may be turned on.

If the seventh transistor T7 is turned on, the initialization voltage $V_{int}$ may be applied to the anode electrode of the organic light emitting device OLED to allow a parasitic capacitor of the organic light emitting device OLED to be discharged.

If the emission control signal Ei provided to the emission control line ECLi has the low level E-LOW, the fifth transistor T5 and the sixth transistor T6 may be turned on. If the fifth transistor T5 is turned on, the first power ELVDD may be provided to the first electrode of the first transistor T1. If the sixth transistor T6 is turned on, the second electrode of the first transistor T1 may be electrically coupled to the anode electrode of the organic light emitting device OLED. In this case, the organic light emitting device OLED may emit light, and brightness of the light emitted from the organic light emitting device OLED may be determined by an amount of current provided to the organic light emitting device OLED.

Figure 5:
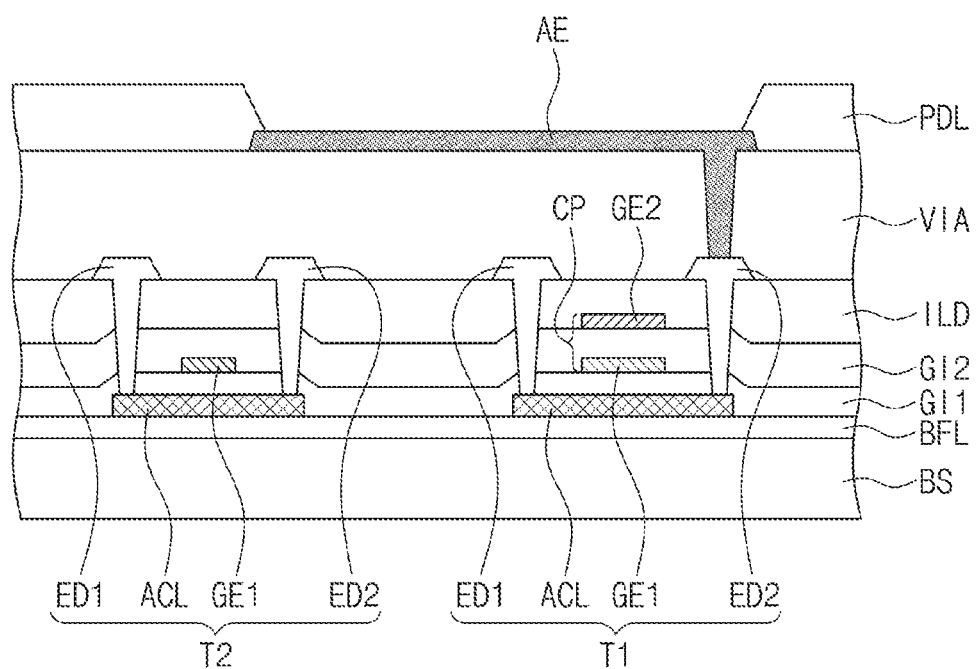
FIG. 5 is a sectional view illustrating a portion of a pixel according to some exemplary embodiments of the inventive concept.

FIG. 5 is a sectional view illustrating a portion of the pixel PX according to some exemplary embodiments of the inventive concept. Although the first transistor T1 and the second transistor T2 are exemplarily illustrated in FIG. 5, the inventive concept is not limited thereto. In the sectional view of FIG. 5, in order to reduce complexity in the drawings and to provide better understanding of exemplary embodiments of the inventive concept, a second electrode ED2 of the first transistor T1 is illustrated to be in direct contact with an anode electrode AE of the pixel PX. However, in reality, as shown in FIG. 3, the first transistor T1 may be connected to the anode electrode AE of the pixel PX through the sixth transistor T6. Furthermore, in certain exemplary embodiments, the second electrode ED2 of the first transistor T1 may be provided to be in direct contact with the anode electrode AE of the pixel PX.

The display panel DP may include a base substrate BS, a buffer layer BFL, gate insulating layers GI1 and GI2, an interlayered insulating layer ILD, a passivation layer VIA, and a pixel definition layer PDL.

The buffer layer BFL may be provided on a surface of the base substrate BS.

The buffer layer BFL may be used to prevent a contamination material in the base substrate BS from entering the pixel PX during the fabrication process. For example, the buffer layer BFL may be used to prevent the contamination material from being diffused into active patterns ACL of the transistors T1 and T2 constituting the pixel PX.

The contamination material may be provided from the outside or may be produced when a thermal process is performed on the base substrate BS. For example, the contamination material may be gas or sodium, which is exhausted from the base substrate BS. In addition, the buffer layer BFL may be configured to prevent moisture from being supplied into the pixel PX from the outside.

The active patterns ACL constituting the transistors T1 and T2 may be provided on the buffer layer BFL. Each of the active patterns ACL may be formed of or include poly silicon or amorphous silicon. In certain exemplary embodiments, the active patterns ACL may be formed of or include at least one of metal oxide semiconductor materials.

Each of the active patterns ACL may include a channel region, which is used as a conduction path of electrons or holes, and a first doped region and a second doped region, which are spaced apart from each other with the channel region interposed therebetween.

A first gate insulating layer GI1 may be provided on the buffer layer BFL to cover the active patterns ACL. The first gate insulating layer GI1 may include an organic layer and/or an inorganic layer. In some exemplary embodiments, the first gate insulating layer GI1 may include a plurality of inorganic layers. The inorganic layers may include a silicon nitride layer and a silicon oxide layer.

The transistors T1 and T2 may include control electrodes GE1 that are provided on the first gate insulating layer GI1. A control electrode GE1 of the first transistor T1 may be used as one of two electrodes constituting the capacitor CP. At least a portion of the scan and emission control lines SL and ECL (e.g., see FIG. 2) may be provided on the first gate insulating layer GI1.

A second gate insulating layer GI2 may be provided on the first gate insulating layer GI1 to cover the control electrodes GE1. The second gate insulating layer GI2 may include an organic layer and/or an inorganic layer. The second gate insulating layer GI2 may include a plurality of inorganic layers. The inorganic layers may include a silicon nitride layer and a silicon oxide layer.

An electrode GE2, which is used as the other one of the two electrodes constituting the capacitor CP (e.g., see FIG. 3), may be placed on the second gate insulating layer GI2. In other words, the electrode GE1 on the first gate insulating layer GI1 and the electrode GE2 on the second gate insulating layer GI2 may be overlapped with each other, thereby constituting the capacitor CP of FIG. 3. However, the inventive concept is not limited to the above structure of the electrodes constituting the capacitor CP.

The interlayered insulating layer ILD may be provided on the second gate insulating layer GI2 to cover the electrode GE2. The interlayered insulating layer ILD may include an organic layer and/or an inorganic layer. In some exemplary embodiments, the interlayered insulating layer ILD may include a plurality of inorganic layers. The inorganic layers may include a silicon nitride layer and a silicon oxide layer.

At least a portion of the data and power lines DL and PL (e.g., see FIG. 2) may be provided on the interlayered insulating layer ILD. Each of the transistors T1 and T2 may include a first electrode ED1 and a second electrode ED2, which are provided on the interlayered insulating layer ILD.

Each of the first and second electrodes ED1 and ED2 may be connected to a corresponding one of the active patterns ACL through penetration holes, which are formed to penetrate the gate insulating layers GI1 and GI2 and the interlayered insulating layer ILD.

The passivation layer VIA may be provided on the interlayered insulating layer ILD to cover the first electrodes ED1 and the second electrodes ED2. The passivation layer VIA may include an organic layer and/or an inorganic layer. The passivation layer VIA may be provided so the whole structure has a flat top surface.

The pixel definition layer PDL and the organic light emitting device OLED may be provided on the passivation layer VIA. For convenience in illustration, only the anode electrode AE of the organic light emitting device OLED is illustrated in FIG. 5. Although not shown, the organic light emitting device OLED may further include a hole transport region, a light emitting layer, an electron transport region, and a cathode, in addition to the anode electrode AE.

Figure 6:
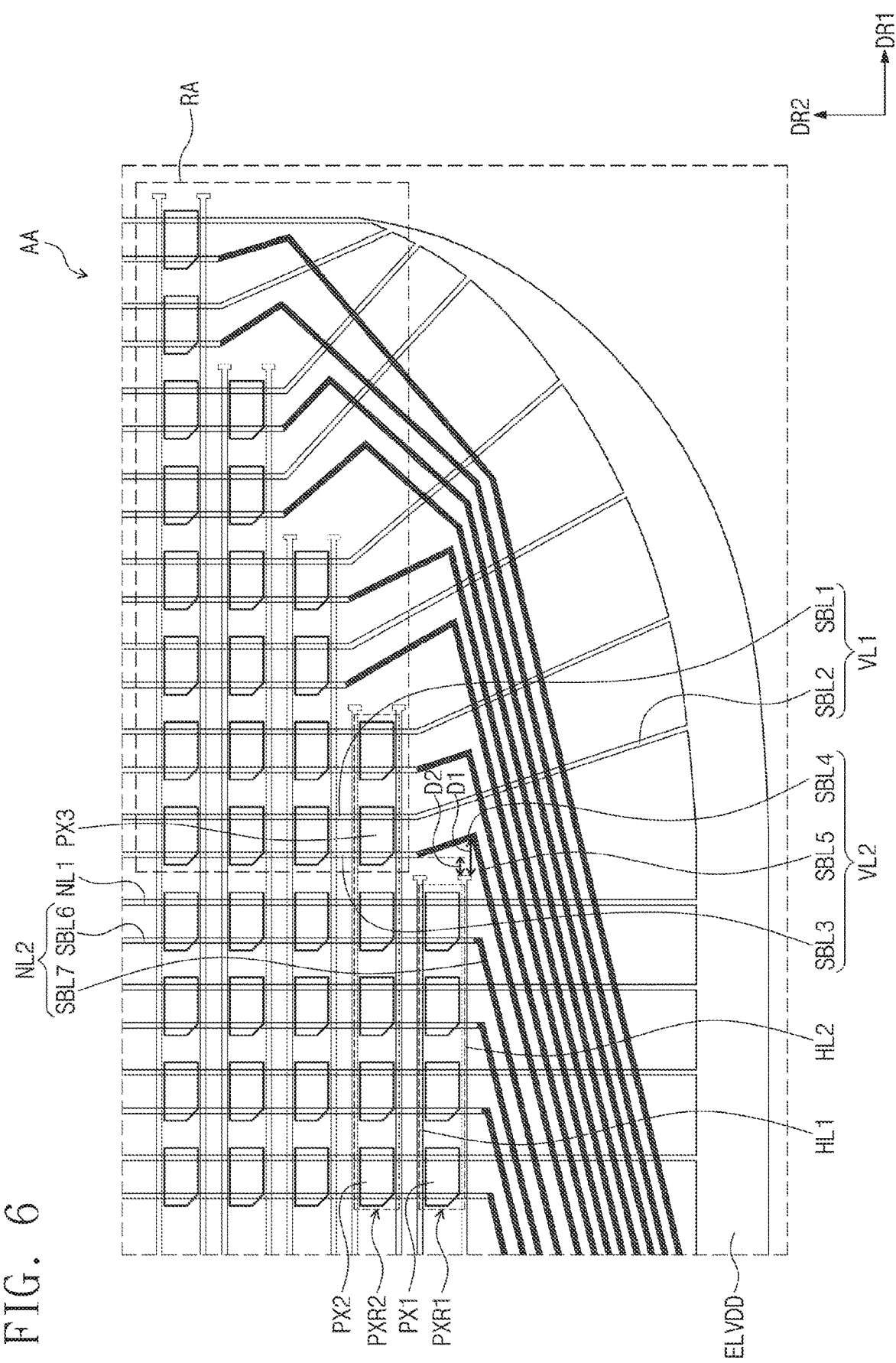
FIG. 6 is an enlarged view illustrating a region "AA" of FIG. 2.
Figure 7A:
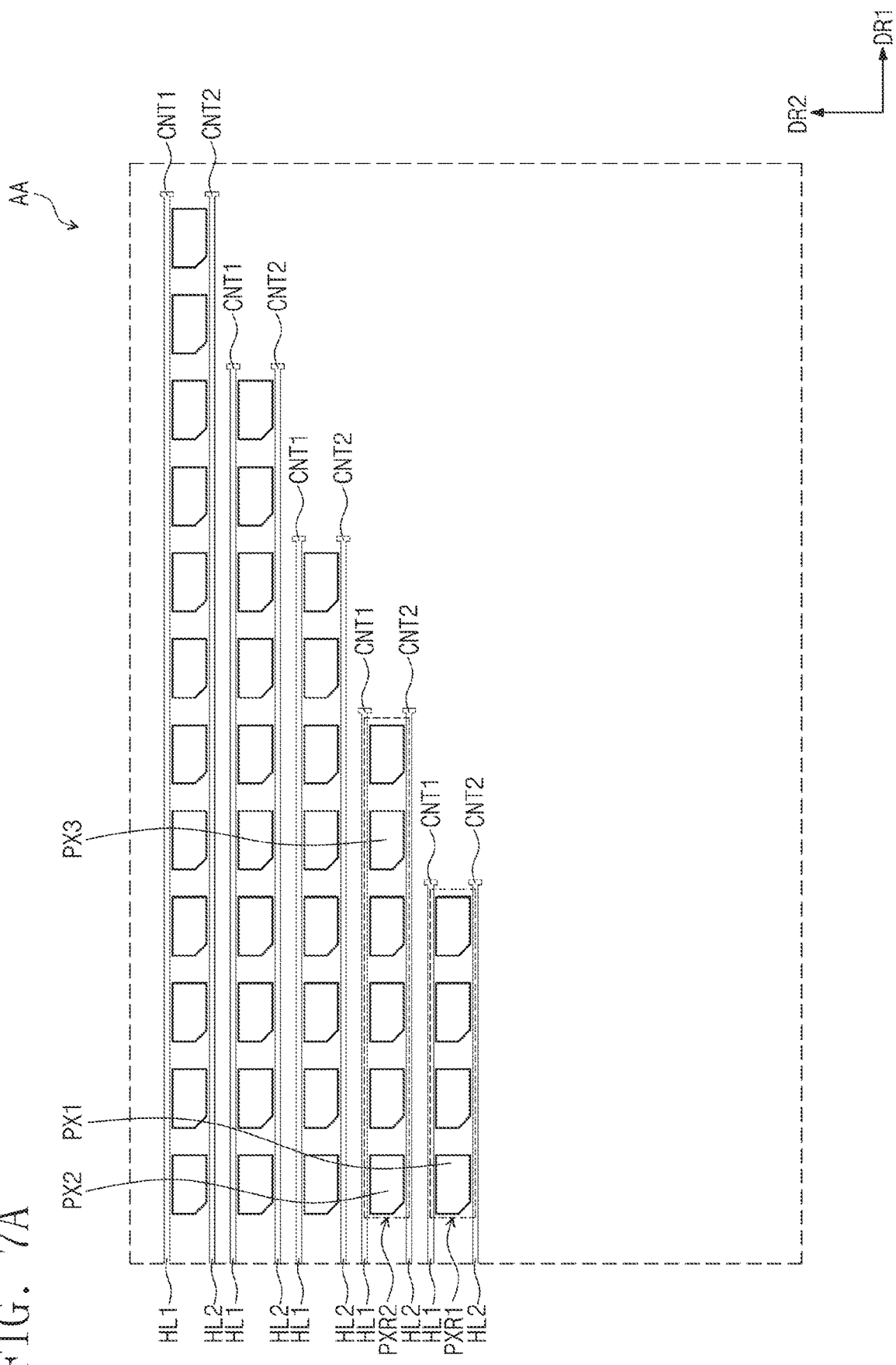
Figure 7C:
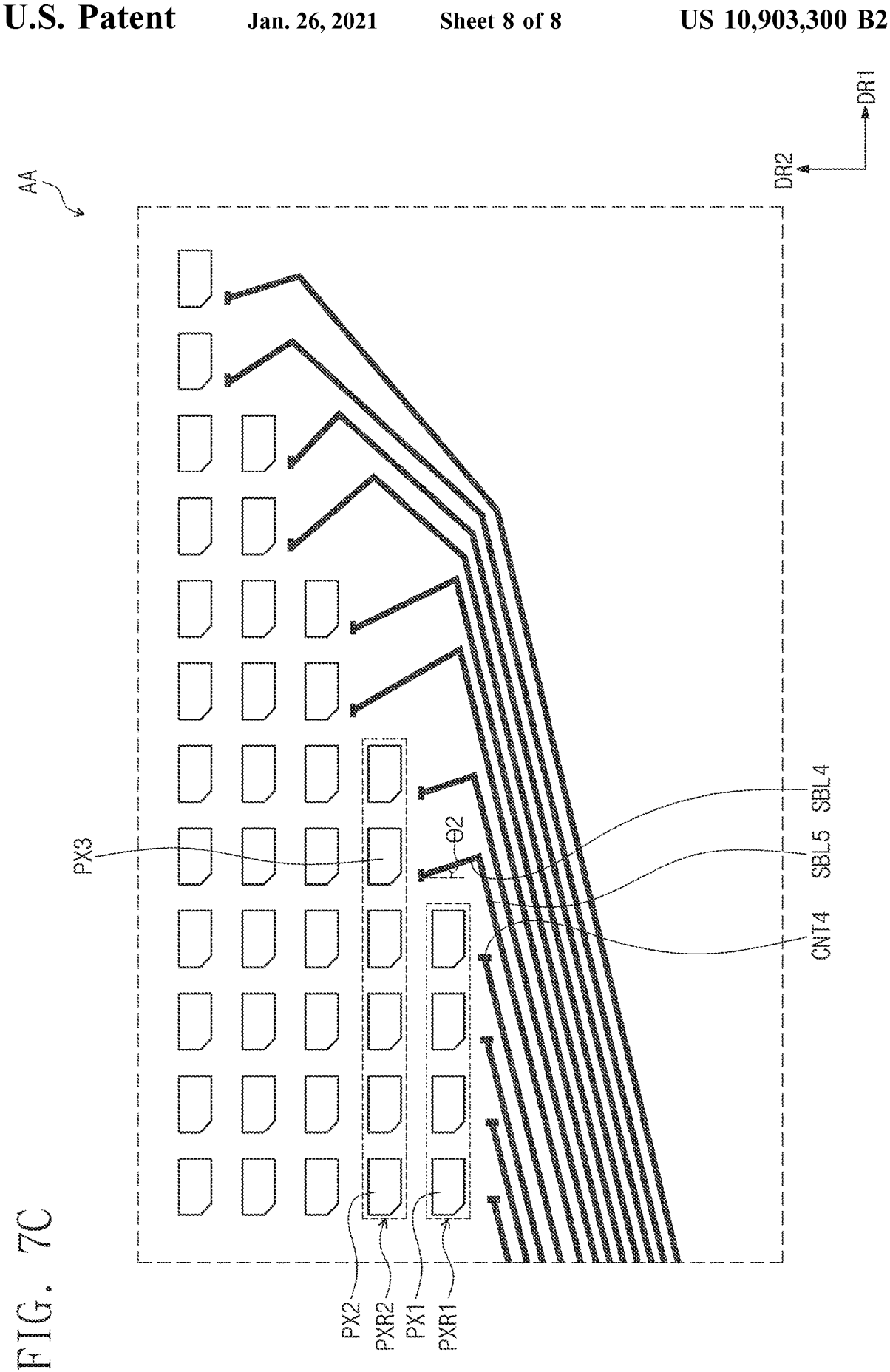

FIG. 6 is an enlarged view illustrating a region "AA" of FIG. 2. FIGS. 7A, 7B, and 7C illustrate lines of FIG. 6 by layer.

The pixels PX may be arranged in a plurality of rows including a first pixel row PXR1 and a second pixel row PXR2.

The first pixel row PXR1 may include n pixels PX, which will be referred to as "first pixels PX1". The second pixel row PXR2 may include m pixels PX, which will be referred to as "second and third pixels PX2 and PX3".

The second pixels PX2 of the second pixel row PXR2 may be overlapped with the first pixels PX1 in the second direction DR2. The third pixels PX3 of the second pixel row PXR2 may not be overlapped with the first pixels PX1 in the second direction DR2. In certain exemplary embodiments, all of the pixels PX of the second pixel row PXR2 may be referred to as the second pixels PX2.

The display panel DP may include a plurality of horizontal lines HL1 and HL2, a plurality of vertical lines VL1 and VL2, and a plurality of normal lines NL1 and NL2.

At least one of the first vertical lines VL1 may include a first sub-line SBL1 and a second sub-line SBL2. At least one of the second vertical lines VL2 may include a third sub-line SBL3, a fourth sub-line SBL4, and a fifth sub-line SBL5. A portion of the second sub-line SBL2 or a portion of the fourth sub-line SBL4 may be overlapped with the first pixel row PXR1, in the first direction DR1.

At least one of the second normal lines NL2 may include a sixth sub-line SBL6 and a seventh sub-line SBL7.

Each of the horizontal lines HL1 and HL2 may be extended in the first direction DR1. Each of the vertical lines VL1 and VL2 may be extended in the second direction DR2. Each of the normal lines NL1 and NL2 may be extended in the second direction DR2.

Referring to FIGS. 2, 6, and 7A, the first horizontal line HL1 may be a portion of the scan line SL. For example, the first horizontal line HL1 may be defined as a portion of the scan line SL provided in the display region DP-DA.

The second horizontal line HL2 may be a portion of the emission control line ECL. For example, the second horizontal line HL2 may be defined as a portion of the emission control line ECL provided in the display region DP-DA.

The first horizontal line HL1 may include a first contact portion CNT1, and the second horizontal line HL2 may include a second contact portion CNT2.

The first horizontal line HL1 may be connected to a first connection line (not shown), which is provided at a different level, through the first contact portion CNT1. The first connection line may be configured to connect the first horizontal line HL1 to the scan driver 100.

The second horizontal line HL2 may be connected to a second connection line (not shown), which is provided at a different level, through the second contact portion CNT2. The second connection line may be configured to connect the second horizontal line HL2 to the scan driver 100.

Referring to FIGS. 2, 6, 7B, and 7C, the first vertical line VL1 may be a portion of the power line PL. The second vertical line VL2 may be a portion of the data line DL.

In some exemplary embodiments, at least one of the first vertical lines VL1 may include a first portion, which is extended in the second direction DR2, and a second portion, which is extended from the first portion in a direction inclined at a first angle θ1 relative to the second direction DR2. The first angle θ1 may be an angle between the first sub-line SBL1 and the second sub-line SBL2. The first angle θ1 may be an acute angle.

At least one of the second vertical lines VL2 may include a third portion, which is extended in the second direction DR2, and a fourth portion, which is extended from the third portion in a direction inclined at a second angle θ2 relative to the second direction DR2. The second angle θ2 may be an angle between the third sub-line SBL3 and the fourth sub-line SBL4.

The bent ones of the first and second vertical lines VL1 and VL2 may be connected to the third pixel PX of the second pixel row PXR2.

As described above, since the second sub-line SBL2 is extended from the first sub-line SBL1 in the first angle θ1 and the fourth sub-line SBL4 is extended from the third sub-line SBL3 in the second angle θ2, the second sub-line SBL2 or the fourth sub-line SBL4 may be extended away from the first pixels PX1. In other words, the second sub-line SBL2 or the fourth sub-line SBL4 may be extended in a direction away from end portions of the horizontal lines HL1 and HL2 connected to the first pixels PX1.

Accordingly, a distance D1 (hereinafter, a first distance) from the fourth sub-line SBL4 to the end portions of the horizontal lines HL1 and HL2 connected to the first pixels PX1 may be increased to be larger than a distance D2 (hereinafter, a second distance) from the fourth sub-line SBL4 to an imaginary extension line, which extends from the third sub-line SBL3 in the second direction DR2. In the case where the first distance D1 is increased to be greater than the second distance D2, it may be possible to suppress or prevent the first pixels PX1 from being damaged by an electrostatic current.

The fifth sub-line SBL5 may be extended from the fourth sub-line SBL4 in a direction toward the center portion of the display panel DP.

Each of the first normal lines NL1 may be a portion of the power line PL. Each of the second normal lines NL2 may be a portion of the data line DL. The sixth sub-line SBL6 may be extended in the second direction DR2, and the seventh sub-line SBL7 may be extended from the sixth sub-line SBL6 in the direction toward the center portion of the display panel DP.

Referring to FIGS. 5 and 7A, the horizontal lines HL1 and HL2 may be provided on the same layer as the control electrodes GE1. For example, the horizontal lines HL1 and HL2 may be provided on the first gate insulating layer GI1.

Referring to FIGS. 5 and 7B, the first sub-lines SBL1, the second sub-lines SBL2, and the third sub-lines SBL3 may be provided on the same layer as the first electrodes ED1 and the second electrodes ED2. For example, the first sub-lines SBL1, the second sub-lines SBL2, and the third sub-lines SBL3 may be provided on the interlayered insulating layer ILD.

Referring to FIGS. 5 and 7C, the fourth sub-lines SBL4 may be provided on the same layer as the electrodes GE2 constituting the capacitor CP. For example, the fourth sub-lines SBL4 may be provided on the second gate insulating layer GI2.

However, the inventive concept is not limited thereto, and the fourth sub-lines SBL4 may be provided on the same layer as the horizontal lines HL1 and HL2 shown in FIG. 7A.

Referring to FIGS. 7B and 7C, the third sub-lines SBL3 may include third contact portions CNT3, and the fourth sub-lines SBL4 may include fourth contact portions CNT4. Each of the third contact portions CNT3 may be electrically connected to a corresponding one of the fourth contact portions CNT4 through a contact hole.

In some exemplary embodiments, positions and functions of the first and second horizontal lines HL1 and HL2 may be changed.

In some exemplary embodiments, positions and functions of the first and second vertical lines VL1 and VL2 may be changed.

For example, as shown in FIGS. 2 and 6, at least one of the data lines DL, which is extended in the rounded region RA, may include an extending portion that is extended away from a central one of the data lines DL arranged in the first direction DR1.

In addition, at least one of the power lines PL, which is extended in the rounded region RA, may include an extending portion that is extended away from a central one of the power lines PL arranged in the first direction DR1.

According to some exemplary embodiments of the inventive concept, it is possible to prevent an electrostatic current, which is produced in an internal interconnection line of a display panel, from flowing to an internal element of a pixel and thereby to prevent the pixel of the display panel from being damaged.

Although certain exemplary embodiments and implementations have been described herein, other exemplary embodiments and modifications will be apparent from this description. Accordingly, the inventive concepts are not limited to such exemplary embodiments, but rather to the broader scope of the appended claims and various obvious modifications and equivalent arrangements as would be apparent to a person of ordinary skill in the art.

What is claimed is:

1. A display panel, comprising:
    a first pixel row comprising a plurality of first pixels arranged in a first direction;
    a second pixel row comprising a plurality of second pixels, each of the plurality of second pixels overlaps each of the plurality of first pixels in a second direction crossing the first direction, and a third pixel, the third pixel does not overlap the plurality of first pixels in the second direction, wherein the plurality of second pixels and the third pixel being arranged in the first direction; and
    a first vertical line comprising a first sub-line, the first sub-line is extended in the second direction and is connected to the third pixel, and a second sub-line, the second sub-line is extended from an end portion of the first sub-line in a direction away from the plurality of first pixels at a first angle relative to the second direction.

2. The display panel of claim 1, wherein the first angle is an acute angle.

3. The display panel of claim 2, wherein a portion of the second sub-line overlaps the first pixel row in the first direction.

4. The display panel of claim 3, wherein the first sub-line and the second sub-line are provided on a same layer.

5. The display panel of claim 3, wherein the first sub-line and the second sub-line are provided on different layers, and the first sub-line and the second sub-line are connected to each other through a contact hole.

6. The display panel of claim 1, wherein the first vertical line is configured to provide electric power to the third pixel, the electric power is supplied from an external element.

7. The display panel of claim 6, further comprising a second vertical line comprising a third sub-line, the third sub-line is extended in the second direction and is connected to the third pixel, and a fourth sub-line, the fourth sub-line is extended from an end portion of the third sub-line in a direction away from the plurality of first pixels at a second angle relative to the second direction.

8. The display panel of claim 7, wherein the second vertical line is configured to provide a data signal to the third pixel.

9. The display panel of claim 8, wherein the third pixel comprises:
    a light emitting device;
    a first transistor electrically connected to the light emitting device; and
    a second transistor connected to the third sub-line,
    wherein each of the first transistor and the second transistor comprises an input electrode, an output electrode, and a control electrode.

10. The display panel of claim 9, wherein the first sub-line, the second sub-line, and the third sub-line are provided on a same layer as the input electrode and the output electrode, and
    the fourth sub-line is provided on a same layer as the control electrode.

11. The display panel of claim 10, further comprising a first horizontal line, the first horizontal line is connected to the third pixel and is extended in the first direction, and
    the first horizontal line and the control electrode are provided on a same layer.

12. The display panel of claim 11, wherein the first horizontal line is configured to provide a scan signal to the control electrode of the second transistor.

13. The display panel of claim 12, further comprising a second horizontal line, the second horizontal line is connected to the third pixel and is extended in the first direction, and the second horizontal line is provided on a same layer as the control electrode and is configured to provide an emission control signal to the third pixel.

14. A display panel, comprising:

a base substrate comprising a display region with corners, at least one of the corners of the display region comprises a rounded region having a rounded shape;

a plurality of organic light emitting devices provided on the display region of the base substrate;

each of a plurality of scan lines configured to provide a scan signal to each of the corresponding ones of the plurality of organic light emitting devices;

each of a plurality of data lines configured to provide a data signal to each of the corresponding ones of the plurality of organic light emitting devices; and each of a plurality of power lines configured to provide an electric power to each of the corresponding ones of the plurality of organic light emitting devices, wherein at least one of the plurality of data lines, which is extended in the rounded region, comprises an extending portion that is extended away from a central one of the plurality of data lines, and at least one of the plurality of power lines, which is extended in the rounded region, comprises an extending portion that is extended away from a central one of the plurality of power lines.

15. A display panel, comprising:

a plurality of first pixels arranged in a first direction, and each of the plurality of first pixels comprises an input electrode, an output electrode, and a control electrode;

a plurality of second pixels arranged in the first direction, and each of plurality of second pixels includes an input electrode, an output electrode, and a control electrode;

a first horizontal line connected to the plurality of first pixels, the first horizontal line is provided on a same layer as the control electrode, and is extended in the first direction; and a first vertical line comprising a first sub-line and a second sub-line, the first sub-line is extended in a second direction crossing the first direction and is connected to one of the plurality of second pixels, the second sub-line is extended away from both of two opposite end portions of the first horizontal line at an angle relative to the second direction.

16. The display panel of claim 15, wherein a number of the plurality of second pixels is greater than a number of the plurality of first pixels.

17. The display panel of claim 16, wherein the first sub-line and the second sub-line are provided on a same layer.

18. The display panel of claim 17, wherein the first vertical line is configured to provide electric power to one of the plurality of second pixels, the electric power is supplied from an external element.

19. The display panel of claim 16, wherein the first sub-line and the second sub-line are provided on different layers, and the first sub-line and the second sub-line are connected to each other through a contact hole.

20. The display panel of claim 19, wherein the first vertical line is configured to provide a data signal to one of the plurality of second pixels.

* * * * *